(12) United States Patent
Nomaru

(10) Patent No.: US 11,975,401 B2
(45) Date of Patent: May 7, 2024

(54) DETECTION DEVICE

(71) Applicant: DISCO CORPORATION, Tokyo (JP)

(72) Inventor: Keiji Nomaru, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 451 days.

(21) Appl. No.: 17/201,068

(22) Filed: Mar. 15, 2021

(65) Prior Publication Data

US 2021/0308789 A1 Oct. 7, 2021

(30) Foreign Application Priority Data

Apr. 6, 2020 (JP) ................................. 2020-068076

(51) Int. Cl.
*B23K 26/03* (2006.01)
*B23K 26/08* (2014.01)
*B23K 26/00* (2014.01)
*B23K 26/064* (2014.01)
*B23K 101/40* (2006.01)

(52) U.S. Cl.
CPC .......... *B23K 26/034* (2013.01); *B23K 26/009* (2013.01); *B23K 26/064* (2015.10); *B23K 26/0853* (2013.01); *B23K 2101/40* (2018.08)

(58) Field of Classification Search
CPC .............. B23K 2101/40; B23K 26/032; B23K 26/0622; B23K 2103/56; B23K 26/0648; B23K 26/082; B23K 26/0853; B23K 26/359; B23K 26/035; B23K 26/04; B23K 26/0626; B23K 26/38; B23K 26/067; B23K 2101/42; B23K 2103/50; B23K 26/048; B23K 26/062; B23K 26/064; B23K 26/0643; B23K 26/0821; B23K 26/083; B23K 26/0861; B23K 26/0869; B23K 26/0884; B23K 26/364; B23K 26/40; B23K 26/402; B23K 26/50; B23K 26/57; G02B 27/283; G02F 1/33; H01S 3/08009; H01S 3/1003; H01S 3/10046; H01S 3/10061; H01S 3/2308; H01S 3/2383
USPC .......... 219/121.61, 121.68, 121.81; 356/630; 425/150

See application file for complete search history.

(56) References Cited

U.S. PATENT DOCUMENTS

| 2008/0180697 | A1* | 7/2008 | Sawabe | B23K 26/0861 356/630 |
| 2017/0014947 | A1* | 1/2017 | Odagiri | B23K 26/032 |
| 2019/0099839 | A1* | 4/2019 | Nomaru | B23K 26/0648 |

FOREIGN PATENT DOCUMENTS

JP 07075955 A 3/1995

\* cited by examiner

*Primary Examiner* — Vy T Nguyen
(74) *Attorney, Agent, or Firm* — Greer Burns & Crain Ltd.

(57) ABSTRACT

A detection mechanism of a detection device includes a pulsed laser oscillator that emits a pulsed laser beam; an fθ lens facing a workpiece held by a chuck table; a thermal excitation section that applies the pulsed laser beam emitted from the pulsed laser oscillator to an upper surface of a wafer through the fθ lens and generates an ultrasonic wave propagated in a spherical form by thermal excitation; and an image forming section that forms an image by capturing a reflected laser beam influenced by vibration of the ultrasonic wave generated by the thermal excitation section, propagated through the inside of the workpiece, reflected by a lower surface of the workpiece, and returned to the upper surface of the workpiece, by an aperture synthesis method.

5 Claims, 4 Drawing Sheets

DETECTION DEVICE

BACKGROUND OF THE INVENTION

Field of the Invention

The present invention relates to a detection device for detecting the inside of a workpiece held by a chuck table.

Description of the Related Art

A wafer formed on a front surface thereof with a plurality of devices such as integrated circuits (ICs) and large-scale integrated circuits (LSIs) partitioned by a plurality of intersecting streets is divided by a dicing apparatus or a laser processing apparatus into individual device chips, and the thus divided device chips are used for electric apparatuses such as mobile phones or personal computers.

In addition, in the case of dividing a wafer formed on a front surface with devices desired to avoid contamination such as a micro electro mechanical system (MEMS), a charge-coupled device (CCD), and a complementary metal oxide semiconductor (CMOS) into individual device chips, dicing or laser processing has been conducted by detecting the streets formed on the front surface from the back surface of the wafer by an infrared camera (see, for example, Japanese Patent Laid-open No. Hei07-075955).

SUMMARY OF THE INVENTION

Incidentally, for example, for making better the electrical properties of the devices formed on the front surface of a wafer, a metal film may be formed on the back surface of the wafer. In that case, infrared rays are not transmitted from the back surface of the wafer, so that the streets formed on the front surface of the wafer cannot be detected from the back surface of the wafer even by use of an infrared camera.

Accordingly, it is an object of the present invention to provide a detection device capable of detecting streets formed on a front surface of a wafer from a back surface, even in the case where the back surface of the wafer is coated with a metal film.

In accordance with an aspect of the present invention, there is provided a detection device including a chuck table including a holding surface defined by X-axis coordinates and Y-axis coordinates that holds a workpiece; a detection mechanism that detects an inside of the workpiece held by the chuck table; an X-axis moving mechanism that relatively moves the chuck table and the detection mechanism in an X-axis direction; and a Y-axis moving mechanism that relatively moves the chuck table and the detection mechanism in a Y-axis direction. In the detection device, the detection mechanism includes thermal excitation means that includes a pulsed laser oscillator configured to emit a pulsed laser beam and an fθ lens facing the workpiece held by the chuck table and that applies the pulsed laser beam emitted from the pulsed laser oscillator to an upper surface of the workpiece held by the chuck table, through the fθ lens, to generate an ultrasonic wave propagated in a spherical form by thermal excitation; and image forming means that forms an image influenced by ultrasonic vibration obtained when the ultrasonic wave generated by the thermal excitation means is propagated through the inside of the workpiece, is reflected by a lower surface of the workpiece, and is returned to the upper surface of the workpiece, by an aperture synthesis method. The image forming means includes a continuous wave laser oscillator that emits a continuous wave laser beam; a beam splitter that branches the laser beam emitted from the continuous wave laser oscillator into a first direction and a second direction; a scanner that scans the laser beam guided into the first direction over a region of the ultrasonic wave reflected by the lower surface of the workpiece and returned to the upper surface, through the fθ lens; a return mirror that is disposed in the second direction and returns the branched continuous wave laser beam to the beam splitter; a photodetector that receives interference light of a first laser beam reflected by the return mirror and returned to the beam splitter and a second laser beam obtained by capturing a reflected beam of the laser beam influenced by ultrasonic vibration at the upper surface of the workpiece held by the chuck table, by the aperture synthesis method, and returning the beam to the beam splitter through the scanning means; and image converting means that converts the interference light received by the photodetector into an image.

Preferably, for both the laser beam emitted from the continuous wave laser oscillator and the pulsed laser beam emitted from the pulsed laser oscillator, such wavelengths with low transmissivity to the workpiece are selected. Preferably, a dichroic mirror is disposed between the fθ lens and the scanner, the pulsed laser beam emitted from the pulsed laser oscillator is guided to the dichroic mirror and is reflected by the dichroic mirror to reach the fθ lens, whereas the laser beam emitted from the continuous wave laser oscillator is guided to the dichroic mirror through the scanner, and passes through the dichroic mirror to reach the fθ lens.

Preferably, the scanner includes an X-axis scanner that scans the laser beam in the X-axis direction and a Y-axis scanner that performs indexing feeding by scanning the laser beam in the Y-axis direction. Alternatively, the scanner includes an X-axis scanner that scans the laser beam in the X-axis direction, and indexing feeding in the Y-axis direction is performed by the Y-axis moving mechanism.

According to the detection device of the present invention, the streets formed on the front surface of the workpiece can be detected from the back surface of the workpiece, even in the case where a metal film is formed as a coating on the back surface side of the workpiece, infrared rays are not transmitted through the workpiece, and the streets formed on the front surface of the workpiece cannot be detected from the back surface of the workpiece by an infrared camera.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
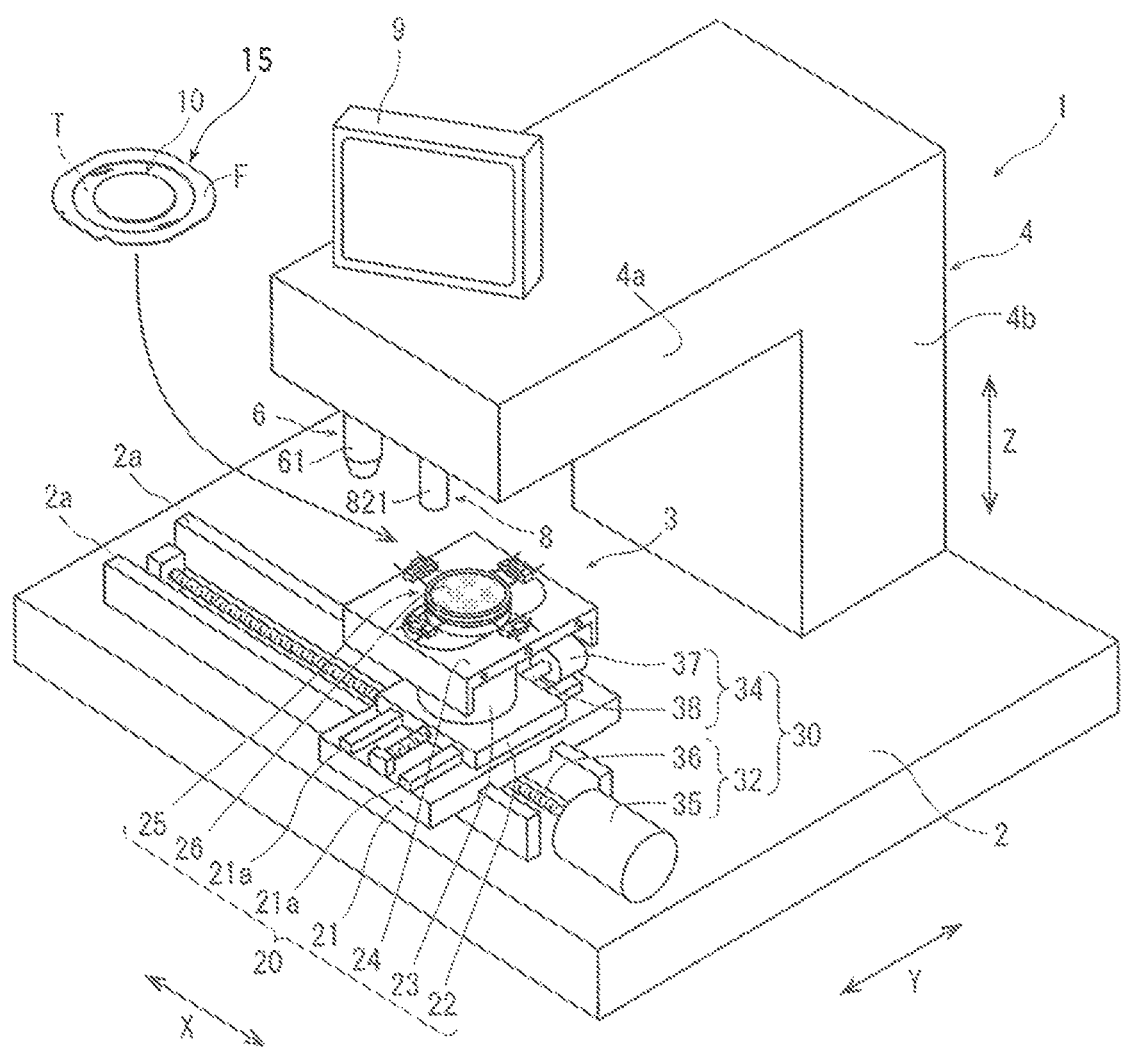
FIG. 1 is a general perspective view of a laser processing apparatus including a detection device according to an embodiment of the present invention.

A detection device according to an embodiment of the present invention will be described in detail below, referring to the attached drawings. FIG. 1 is a general perspective view of a laser processing apparatus 1 including a detection device 3 of the present invention. The laser processing apparatus 1 includes a laser beam applying unit 6, a display unit 9, and an unillustrated control unit, in addition to the detection device 3.

The detection device 3 includes a holding unit 20 that holds a workpiece, a detection mechanism 8 that detects the inside of the workpiece held by the holding unit 20, and a moving mechanism 30 that relatively moves the holding unit 20 and the detection mechanism 8.

The holding unit 20 includes a rectangular X-axis direction movable plate 21 mounted on a base 2 movably in an X-axis direction, a rectangular Y-axis direction movable plate 22 mounted on the X-axis direction movable plate 21 movably along guide rails 21a in a Y-axis direction, a cylindrical support column 23 fixed to an upper surface of the Y-axis direction movable plate 22, and a rectangular cover plate 24 fixed to an upper end of the support column 23. At the cover plate 24, disposed is a chuck table 25 which is a circular member extending upward through a slot formed in the cover plate 24 and which is configured to be rotatable by an unillustrated rotational drive unit. The chuck table 25 is formed of a gas-permeable porous material, and includes a holding surface 26 defined by the X-axis direction and the Y-axis direction. The holding surface 26 is connected to unillustrated suction means by a flow channel passing through the support column 23. Note that the X-axis direction is a direction indicated by an arrow X in FIG. 1, whereas the Y-axis direction is a direction indicated by an arrow Y and orthogonal to the X-axis direction. A plane defined by the X-axis direction and the Y-axis direction is substantially horizontal.

The moving mechanism 30 includes an X-axis moving mechanism 32 that relatively moves the chuck table 25 of the holding unit 20 and the detection mechanism 8 in the X-axis direction and a Y-axis moving mechanism 34 that relatively moves the chuck table 25 of the holding unit 20 and the detection mechanism 8 in the Y-axis direction. The X-axis moving mechanism 32 has a ball screw 36 extending in the X-axis direction on the base 2 and a motor 35 connected to one end portion of the ball screw 36. A nut section (omitted from illustration) of the ball screw 36 is fixed to a lower surface of the X-axis direction movable plate 21. The X-axis moving mechanism 32 converts a rotational motion of the motor 35 into a rectilinear motion and transmits the rectilinear motion to the X-axis direction movable plate 21 by the ball screw 36, to thereby advance and retract the X-axis direction movable plate 21 in the X-axis direction along guide rails 2a on the base 2. The Y-axis moving mechanism 34 has a ball screw 38 extending in the Y-axis direction on the X-axis direction movable plate 21 and a motor 37 connected to one end portion of the ball screw 38. A nut section of the ball screw 38 is formed on the Y-axis direction movable plate 22. The Y-axis moving mechanism 34 converts a rotational motion of the motor 37 into a rectilinear motion and transmits the rectilinear motion to the Y-axis direction movable plate 22 by the ball screw 38, to thereby advance and retract the Y-axis direction movable plate 22 in the Y-axis direction along the guide rails 21a on the X-axis direction movable plate 21.

On the depth side of the holding unit 20, erected is a frame body 4 which includes a vertical wall section 4b extending upward from an upper surface of the base 2 and a horizontal wall section 4a extending substantially horizontally. The horizontal wall section 4a accommodates the laser beam applying unit 6 and an optical system of the detection mechanism 8. A beam condenser 61 constituting the laser beam applying unit 6 is disposed on a lower surface of a tip end of the horizontal wall section 4a of the frame body 4, and a 1 beam condenser 821 of the detection mechanism 8 is disposed at a position spaced from the beam condenser 61 in the X-axis direction.

Figure 2:
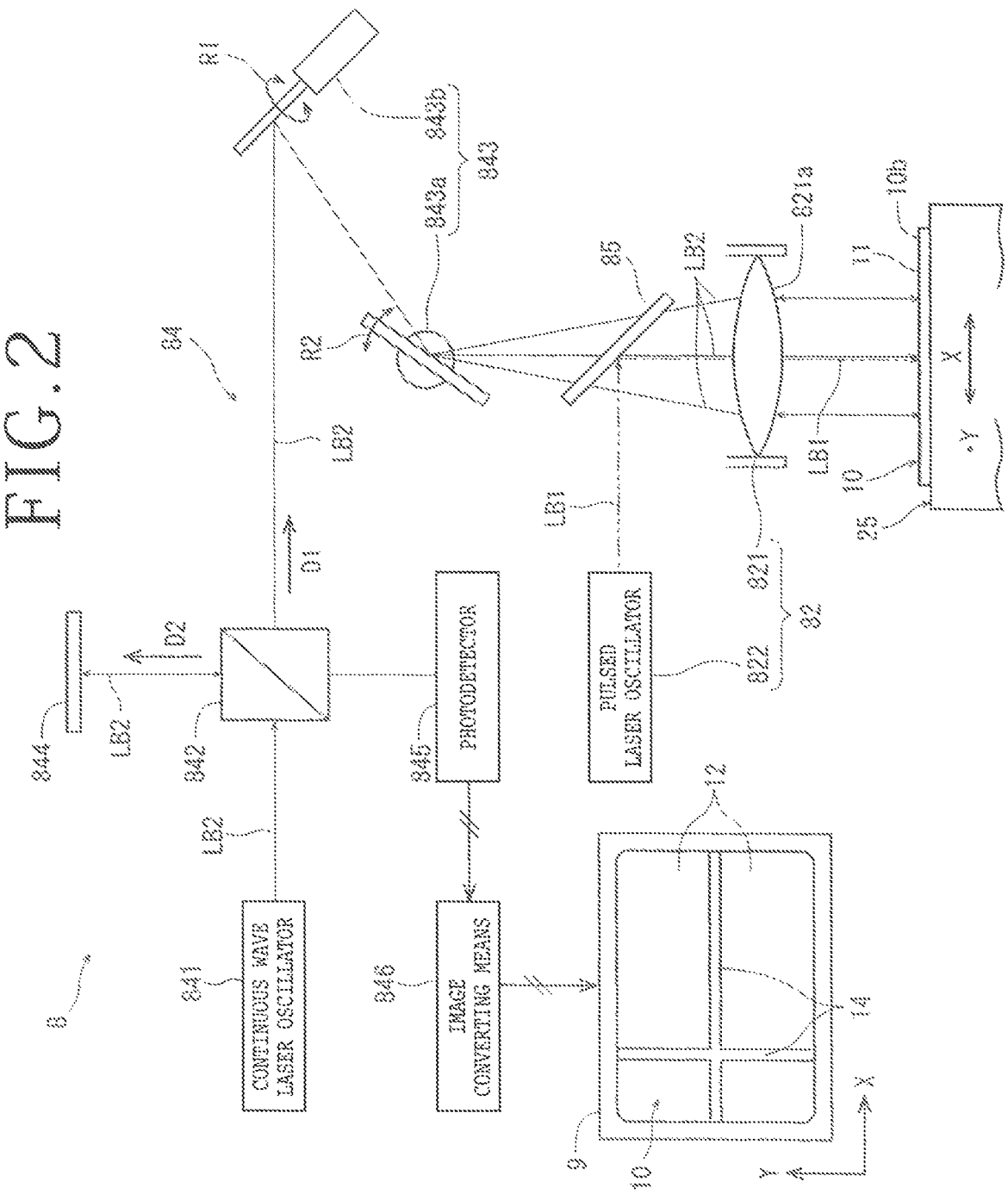
FIG. 2 is a block diagram depicting the outline of an optical system of a detection mechanism constituting the detection device depicted in FIG. 1.

FIG. 2 is a block diagram depicting the outline of an optical system constituting the detection mechanism 8. As illustrated in FIG. 2, the detection mechanism 8 includes thermal excitation means 82 and image forming means 84. The thermal excitation means 82 includes a beam condenser 821 including an fθ lens 821a facing a wafer 10 held by the chuck table 25 of the holding unit 20 and a pulsed laser oscillator 822 that emits a pulsed laser beam LB1 (indicated by alternate long and two short dashes line), applies the pulsed laser beam LB1 emitted by the pulsed laser oscillator 822 to an upper surface of the wafer 10 held by the chuck table 25 through the fθ lens 821a, and generates an ultrasonic wave propagated in a spherical form in the wafer 10 by thermal excitation.

The image forming means 84 includes a continuous wave laser oscillator 841 that generates a continuous wave laser beam LB2 (indicated by a solid line); a beam splitter 842 that branches the laser beam LB2 emitted from the continuous wave laser oscillator 841 into a first direction D1 and a second direction D2; a scanner 843 that scans the laser beam LB2 branched into the first direction D1, through the fθ lens 821a; a return mirror 844 that is disposed in the second direction D2 and returns the branched continuous wave laser beam LB2 to the beam splitter 842; a photodetector 845 that receives interference light of the laser beam LB2 reflected by the return mirror 844 and returned to the beam splitter 842 and the laser beam LB2 obtained when a reflected beam of the laser beam influenced by vibration of ultrasonic wave that is generated by the thermal excitation means 82, propagated through the inside of the wafer 10 held by the chuck table 25, reflected by a lower surface of the wafer 10, and returned to an upper surface of the wafer 10 is captured by an aperture synthesis method and returned to the beam splitter 842 through the scanner 843; and image converting means 846 that functions as an analyzer and converts the interference light received by the photodetector 845 into an image. With the image forming means 84 operated, it is possible to capture the vibration of the ultrasonic wave generated by the thermal excitation means 82, propagated through the inside of the wafer 10, reflected by the lower surface of the wafer 10, and returned to the upper surface of the wafer 10, by the aperture synthesis method, and to form an image. The image converted and formed by the image converting means 846 is displayed on the display unit 9.

The scanner 843 includes an X-axis scanner 843a that scans the laser beam LB2 in the X-axis direction on the chuck table 25 of the holding unit 20 by reflecting the laser beam LB2 by a reflecting surface rotated in the direction indicated by R2 and a Y-axis scanner 843b that performs indexing feeding by reflecting the laser beam LB2 by a reflecting surface rotated in the direction indicated by R1 and thereby scanning the laser beam LB2 in the Y-axis direction on the chuck table 25. The X-axis scanner 843a is preferably selected, for example, from a Galvano scanner or a resonant scanner. In addition, as the Y-axis scanner 843b, there is used, for example, a Galvano scanner.

A dichroic mirror 85 is disposed between the scanner 843 and the fθ lens 821a. The pulsed laser beam LB1 emitted from the pulsed laser oscillator 822 is guided to the dichroic mirror 85, is reflected by the dichroic mirror 85, with a change in the optical path, and reaches the fθ lens 821a; the laser beam LB2 emitted from the continuous wave laser oscillator 841 passes through the dichroic mirror 85 through the scanner 843, to reach the fθ lens 821a, and both the laser beams LB1 and LB2 are applied to the wafer 10 on the chuck table 25.

For both the pulsed laser beam LB1 emitted from the pulsed laser oscillator 822 and the laser beam LB2 emitted from the continuous wave laser oscillator 841, such wavelengths with low transmissivity to the wafer 10 are selected.

The laser processing apparatus 1 including the detection device 3 of the present invention generally has the above-mentioned configuration, and the function and action of the detection device 3 will be described below.

Figure 3A:
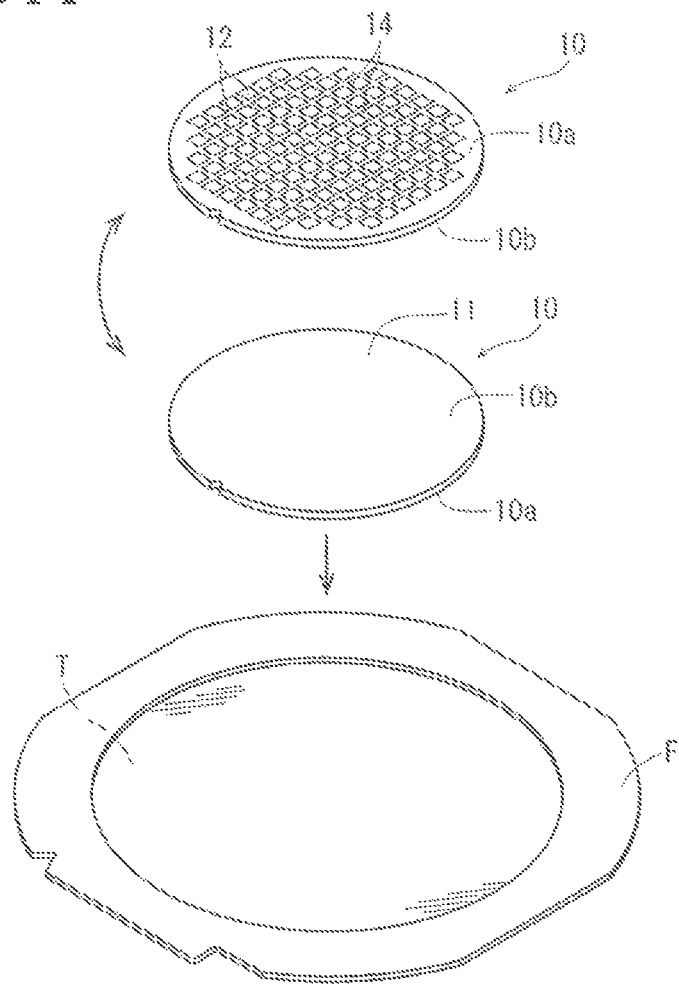
FIG. 3A is a divisional perspective view of a wafer unit.
Figure 3B:
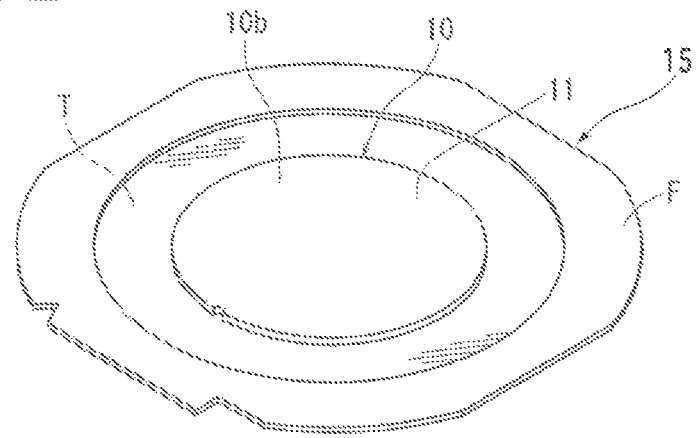
FIG. 3B is a perspective view of the wafer unit.

The workpiece in the present embodiment is a wafer 10 as depicted in FIG. 3A. The wafer 10 is, for example, a disk-shaped semiconductor wafer with a substrate of silicon, sapphire, gallium arsenide, or the like, and a plurality of devices 12 are formed on a front surface 10a partitioned by streets 14. In addition, on a back surface 10b side of the wafer 10, a metal film 11 having a heat radiating effect and a function as an electrode is formed. When such a wafer 10 is prepared, as illustrated in the figure, the wafer 10 is positioned at an opening of a plate-shaped annular frame F having an opening which can accommodate the wafer 10, with the back surface 10b formed with the metal film 11 directed to the upper side and with the front surface 10a side directed to the lower side, and the wafer 10 is supported by the frame F through an adhesive tape T, to form a wafer unit 15 depicted in FIG. 3B. Next, the wafer 10 of the wafer unit 15 is placed on a chuck table 25 depicted in FIGS. 1 and 2, and unillustrated suction means is operated to suction hold the wafer 10.

Subsequently, the X-axis moving mechanism 32 and the Y-axis moving mechanism 34 are operated to position the wafer 10 at a predetermined position where the pulsed laser beam LB1 and the laser beam LB2 are applied to the wafer 10 through the fθ lens 821a of the beam condenser 821 of the detection mechanism 8. Note that, in the present embodiment, the wavelength of the laser beam LB2 emitted by the continuous wave laser oscillator 841 is 635 nm, while the wavelength of the pulsed laser beam LB1 emitted by the pulsed laser oscillator 822 is 355 nm, both of the wavelengths being selected to have low transmissivity to the substrate constituting the wafer 10 and to have low transmissivity to the metal film 11. In addition, the region of the inside of the wafer 10 that can be detected by the detection mechanism 8 at a time is a partial region with respect to the whole of the wafer 10, and the inside of the wafer 10 is detected by a number of detecting steps. Thus, first, a predetermined region of the wafer 10 of which the inside is to be detected first is positioned directly below the fθ lens 821a.

The metal film 11 is formed on the back surface 10b side of the wafer 10 as described above, and the devices 12 and the streets 14 formed on the front surface 10a cannot be imaged from the back surface 10b side, even by use of an infrared camera or the like. In view of this, in the present embodiment, the abovementioned thermal excitation means 82 and the image forming means 84 are operated to detect the form of the inside of the wafer 10, specifically, the vicinity of the front surface 10a of the wafer 10. The procedure of this will be described below.

Figure 4:
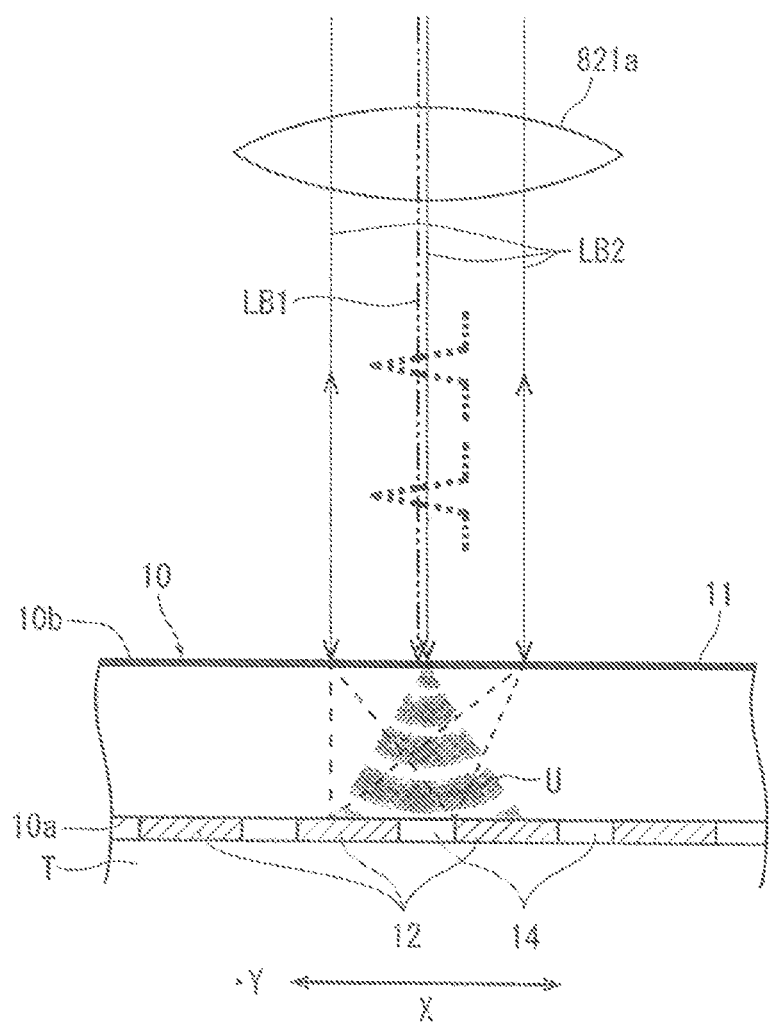
FIG. 4 is a partially enlarged sectional view depicting the manner in which the detection device of the present embodiment detects the inside of a wafer.

When the predetermined region of the wafer 10 is positioned directly below the fθ lens 821a as described above, the pulsed laser oscillator 822 of the thermal excitation means 82 is operated as depicted in FIG. 2, and the pulsed laser beam LB1 emitted by the pulsed laser oscillator 822 is reflected by the dichroic mirror 85, to be applied to the upper surface of the wafer 10 held by the chuck table 25 of the holding unit 20, i.e., to the metal film 11 on the back surface 10b of the wafer 10, through the fθ lens 821a. The application position of the pulsed laser beam LB1 in this instance is the center position of the predetermined region of the wafer 10 of which the inside is to be detected. When the pulsed laser beam LB1 is applied to the metal film 11 of the wafer 10, an ultrasonic wave U propagated in a spherical form from the application position of the pulsed laser beam LB1 is generated by thermal excitation, as depicted in FIG. 4. Such an ultrasonic wave U is propagated in a spherical form through the inside of the wafer 10 to reach the lower surface, i.e., the front surface 10a side of the wafer 10, and reflected and returned to the upper surface (back surface 10b) side.

Simultaneously with the operation of the thermal excitation means 82, the continuous wave laser oscillator 841 constituting the image forming means 84 is operated, as depicted in FIG. 2, whereby the continuous wave laser beam LB2 emitted from the continuous wave laser oscillator 841 is branched in the beam splitter 842 into a direction (first direction D1) toward the holding unit 20 side and a direction (second direction D2) toward the return mirror 844, and the laser beam LB2 branched into the first direction D1 is guided to the scanner 843. With the X-axis scanner 843a and the Y-axis scanner 843b constituting the scanner 843 being operated, the laser beam LB2 guided is scanned over the whole of the predetermined region defined in the X-axis direction and the Y-axis direction.

As illustrated in FIG. 4, the ultrasonic wave U (a part of which is indicated by a dotted line) that is propagated through the inside of the wafer 10 and that reaches the lower surface (front surface 10a) to be reflected there returns to the upper surface (back surface 10b) while reflecting thereon influenced by the shape of the position of the lower surface, is modified by the shape of the lower surface, and vibrates the upper surface side. The abovementioned laser beam LB2 is applied to the predetermined region of the upper surface, the laser beam LB2 is reflected while being influenced by the vibration of the ultrasonic wave U returned to the upper surface, returns to the beam splitter 842 through the scanner 843, and is reflected by the beam splitter 842, to be applied to the photodetector 845. Simultaneously, the laser beam LB2 guided to and reflected by the return mirror 844 and passing through the beam splitter 842 is applied to the photodetector 845. In other words, interference light of the laser beam LB2 influenced by the vibration of the ultrasonic wave U that is reflected by the lower surface of the wafer 10 and the laser beam LB2 not influenced by the vibration of the ultrasonic wave U that is reflected by the return mirror 844 is guided to the photodetector 845. A signal of the interference light received by the photodetector 845 is sent to the image converting means 846, and is converted into an appropriate image while the modulation of the vibration at the upper surface of the wafer 10 held by the chuck table 25 of the holding unit 20 is captured by the aperture synthesis method. The image signal converted based on the interference light is displayed on the display unit 9 corresponding to the position of the X-axis coordinate and the Y-axis coordinate where the laser beam LB2 is applied (see FIG. 2). When the shape on the front surface 10a side of the wafer 10 in the predetermined region is displayed on the display unit 9 as depicted in the figure, the positions and directions of the streets 14 partitioning the devices 12 are specified in terms of the X-axis coordinates and the Y-axis coordinates, and are stored in the unillustrated control unit.

When the positions, directions, and the like of the streets 14 on the front surface 10a in the predetermined region of the wafer 10 are detected as described above, the X-axis moving mechanism 32 and the Y-axis moving mechanism 34 constituting the moving mechanism 30 of the holding unit 20 are operated, to position the predetermined region of the wafer 10 of which the shape of the front surface 10a is to be detected next, directly below the fθ lens 821a. Then, similarly as described above, the thermal excitation means 82 and the image forming means 84 are operated, to detect the shape of the front surface 10a and store the shape in the control unit. In this way, the regions of the wafer 10 of which the inside is required to be detected are sequentially positioned directly below the fθ lens 821a, and the positions and directions of the streets 14 formed on the front surface 10a are detected.

When the streets 14 on the front surface 10a of the wafer 10 are detected and stored in the control unit as described above, the chuck table 25 is positioned directly below the laser beam applying unit 6, and predetermined laser processing for forming division start points along the streets 14 is performed. Note that a specified mode of the laser processing does not constitute the gist of the present invention, and, thus, the specified mode is omitted in the description of the present embodiment.

According to the abovementioned embodiment, even in the case where the metal film 11 is provided on the back surface 10b side of the wafer 10 as a coating so that infrared rays are not transmitted through the wafer 10 and the streets 14 formed on the front surface 10a cannot be detected from the back surface 10b of the wafer 10 by an infrared camera, the streets 14 formed on the front surface 10a can be detected from the back surface 10b of the wafer 10.

Note that, while an example in which the shape of the front surface 10a of the wafer 10 is detected from the back surface 10b side of the wafer 10 formed with the metal film 11 on the back surface 10b side has been illustrated in the abovementioned embodiment, the present invention is not limited to this; the present invention is applicable to any workpiece in which an ultrasonic wave propagated in a spherical form is generated by thermal excitation by application of a pulsed laser beam LB1 thereto.

In addition, while an example in which the scanner 843 in the abovementioned embodiment includes the X-axis scanner 843a that scans the laser beam LB2 in the X-axis direction and the Y-axis scanner 843b that performs indexing feeding by scanning the laser beam LB2 in the Y-axis direction has been described above, the present invention is not limited to this. For example, the Y-axis scanner 843b may be eliminated, so that relatively moving and indexing feeding the detection mechanism 8 and the chuck table 25 in the Y-axis direction are performed by operating the Y-axis moving mechanism 34 that moves the chuck table 25 in the Y-axis direction.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A detection device comprising:
    a chuck table including a holding surface defined by X-axis coordinates and Y-axis coordinates that holds a workpiece;
    a detection mechanism that detects an inside of the workpiece held by the chuck table;
    an X-axis moving mechanism that moves the chuck table relative to the detection mechanism in an X-axis direction; and
    a Y-axis moving mechanism that moves the chuck table relative to the detection mechanism in a Y-axis direction,
    wherein the detection mechanism includes:
        thermal excitation means that include a pulsed laser oscillator configured to emit a pulsed laser beam and an fθ lens facing the workpiece held by the chuck table and that applies the pulsed laser beam emitted from the pulsed laser oscillator to an upper surface of the workpiece held by the chuck table, through the fθ lens, to generate an ultrasonic wave propagated in a spherical form by thermal excitation, and
        image forming means that form an image influenced by vibration of the ultrasonic wave obtained when the ultrasonic wave generated by the thermal excitation means is propagated through the inside of the workpiece, is reflected by a lower surface of the workpiece, and is returned to the upper surface of the workpiece, by an aperture synthesis method, and
    the image forming means include:
        a continuous wave laser oscillator that emits a continuous wave laser beam,
        a beam splitter that branches the laser beam emitted from the continuous wave laser oscillator into a first direction and a second direction,
        a scanner that scans the laser beam guided into the first direction over a region of the ultrasonic wave reflected by the lower surface of the workpiece and returned to the upper surface, through the fθ lens,
        a return mirror that is disposed in the second direction and returns the branched continuous wave laser beam to the beam splitter,
        a photodetector that receives interference light of a first laser beam reflected by the return mirror and returned to the beam splitter and a second laser beam obtained by capturing a reflected beam of the laser beam influenced by vibration of the ultrasonic wave at the upper surface of the workpiece held by the chuck table, by the aperture synthesis method, and returning the laser beam to the beam splitter through the scanner, and
        image converting means that convert the interference light received by the photodetector into an image.

2. The detection device according to claim 1, wherein the laser beam emitted by the continuous wave laser oscillator and the pulsed laser beam emitted by the pulsed laser oscillator have such wavelengths with low transmissivity to the workpiece.

3. The detection device according to claim 1,
    wherein the image forming means further include a dichroic mirror disposed between the fθ lens and the scanner, and
    the pulsed laser beam emitted from the pulsed laser oscillator is guided to the dichroic mirror, and is reflected by the dichroic mirror to reach the fθ lens, whereas the laser beam emitted from the continuous wave laser oscillator is guided to the dichroic mirror through the scanner, and passes through the dichroic mirror to reach the fθ lens.

4. The detection device according to claim 1, wherein the scanner includes an X-axis scanner that scans the laser beam in the X-axis direction and a Y-axis scanner that performs indexing feeding by scanning the laser beam in the Y-axis direction.

5. The detection device according to claim 1, wherein the scanner includes an X-axis scanner that scans the laser beam in the X-axis direction, and indexing feeding in the Y-axis direction is performed by the Y-axis moving mechanism.

\* \* \* \* \*